United States Patent
Lam et al.

(10) Patent No.: US 10,301,508 B2
(45) Date of Patent: May 28, 2019

(54) POLISHING COMPOSITION COMPRISING CATIONIC POLYMER ADDITIVE

(71) Applicant: Cabot Microelectronics Corporation, Aurora, IL (US)

(72) Inventors: Viet Lam, Naperville, IL (US); Tina Li, Warrenville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 15/414,786

(22) Filed: Jan. 25, 2017

(65) Prior Publication Data
US 2017/0210946 A1 Jul. 27, 2017

Related U.S. Application Data

(60) Provisional application No. 62/286,742, filed on Jan. 25, 2016.

(51) Int. Cl.
| | |
|---|---|
| *C09G 1/02* | (2006.01) |
| *B24B 37/04* | (2012.01) |
| *H01L 21/3105* | (2006.01) |
| *C09K 3/14* | (2006.01) |

(52) U.S. Cl.
CPC .............. *C09G 1/02* (2013.01); *B24B 37/044* (2013.01); *C09K 3/1463* (2013.01); *H01L 21/31053* (2013.01)

(58) Field of Classification Search
CPC ....................................................... C09G 1/02
USPC ....................................................... 216/693
See application file for complete search history.

(56) References Cited

U.S. PATENT DOCUMENTS

| | | |
|---|---|---|
| 6,576,554 B2 | 6/2003 | Matsui et al. |
| 7,494,519 B2 | 2/2009 | Fletcher et al. |
| 2002/0011031 A1 | 1/2002 | Hattori et al. |
| 2003/0165412 A1 | 9/2003 | Matsui et al. |
| 2004/0209555 A1 | 10/2004 | Sun et al. |
| 2005/0005525 A1 | 1/2005 | Li et al. |
| 2005/0009322 A1 | 1/2005 | Matsui et al. |
| 2005/0175811 A1* | 8/2005 | Kubota ............... D06M 13/213 428/96 |

(Continued)

FOREIGN PATENT DOCUMENTS

WO 0130928 A1 5/2001

OTHER PUBLICATIONS

Taiwan Intellectual Property Office, Search Report issued in connection with Taiwan Patent Application No. 106103032 dated Jul. 25, 2017.

(Continued)

*Primary Examiner* — Roberts P Culbert
(74) *Attorney, Agent, or Firm* — Thomas Omholt; Erika S. Wilson; Francis J. Koszyk

(57) ABSTRACT

The invention provides a chemical-mechanical polishing composition comprising (a) wet-process ceria, (b) a water-soluble cationic polymer or copolymer, (c) an aromatic carboxylic acid or heteroaromatic carboxylic acid, and (d) water, wherein the polishing composition has a pH of about 3 to about 6. The invention further provides a method of chemically-mechanically polishing a substrate with the inventive chemical-mechanical polishing composition. Typically, the substrate contains silicon oxide.

6 Claims, 1 Drawing Sheet

(56) References Cited

U.S. PATENT DOCUMENTS

2006/0099814 A1* 5/2006 Carter .................. C09G 1/02
                                                              438/692
2006/0108326 A1   5/2006 Dysard et al.
2007/0220813 A1   9/2007 Nam et al.

OTHER PUBLICATIONS

Korean Intellectual Property Office/ISA, International Search Report issued in connection with Patent Application No. PCT/US2017/014821 dated May 4, 2017.

* cited by examiner

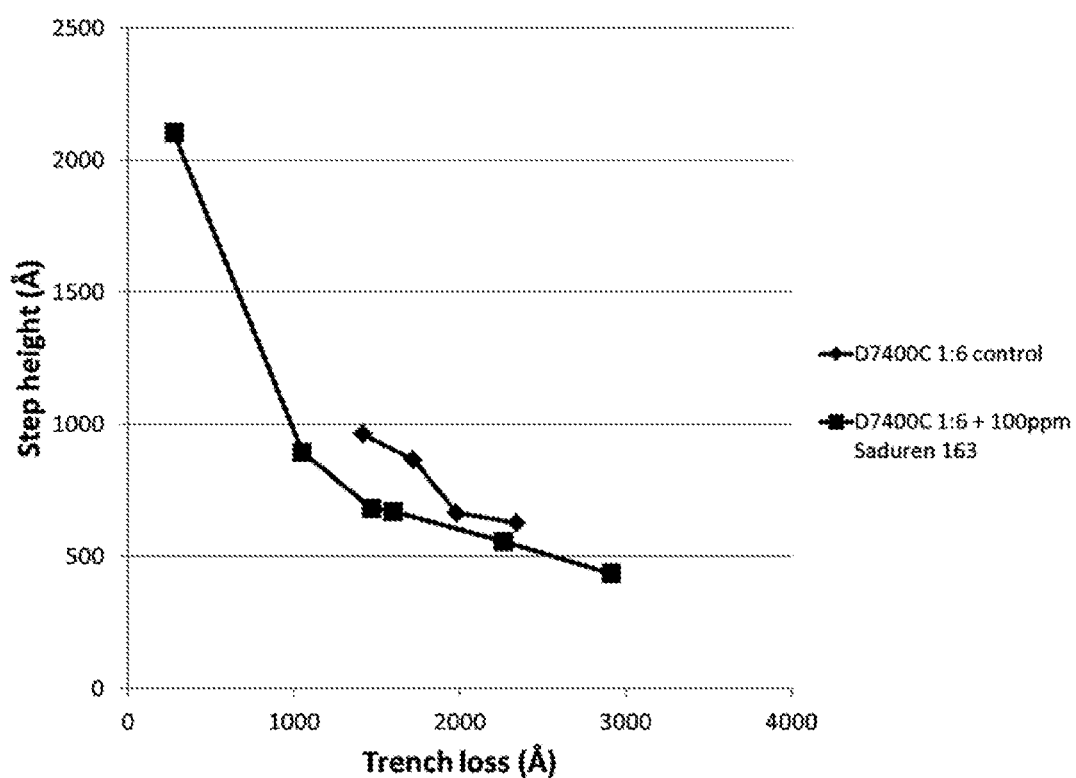

POLISHING COMPOSITION COMPRISING CATIONIC POLYMER ADDITIVE

BACKGROUND OF THE INVENTION

During the fabrication of integrated circuits, chemical-mechanical polishing (CMP) processes are typically utilized in order to form planar surfaces for a semiconductor device structure. Polishing compositions (also known as polishing slurries) typically contain an abrasive material in a liquid carrier along with other chemical components and are applied to a surface by contacting the surface with a rotating polishing pad saturated with the polishing composition. The chemical components chemically modify at least some of the substrate material to promote physical removal by the combination of the abrasive and the polishing pad. In some instances, the chemical components may also promote removal of material.

In microelectronic structures such as CMOS transistors and NAND gates, substrate features such as metal gates are often overlaid with a layer of a dielectric material, which is then planarized to expose the metal gates separated by the dielectric material. Prior to planarization, the substrate surface is characterized by "high" areas overlying the gates and "low" areas which lie between the gates. Initially, the high areas are removed more quickly than the low areas because the pressure exerted by the polishing pad is directed primarily at the high areas. As the planarization proceeds, due in part to the deformability of the polishing pad, the low areas experience material removal, resulting in what is referred to as trench loss.

Polishing compositions comprising ceria abrasives have been explored for polishing such dielectric-layered substrates. While dielectric removal rates can be improved, trench loss becomes increasing significant as the removal rate increases. Thus, there is a need in the art for dielectric polishing compositions exhibiting good removal rates while also exhibiting reduced trench loss.

BRIEF SUMMARY OF THE INVENTION

The invention provides a chemical-mechanical polishing composition comprising (a) wet-process ceria, (b) a water-soluble cationic polymer or copolymer, (c) an aromatic carboxylic acid or heteroaromatic carboxylic acid, and (d) water, wherein the polishing composition has a pH of about 3 to about 6.

The invention also provides a method of chemically mechanically polishing a substrate comprising (i) contacting a substrate with a polishing pad and a chemical-mechanical polishing composition comprising (a) wet-process ceria, (b) a water-soluble cationic polymer or copolymer, (c) an aromatic carboxylic acid or heteroaromatic carboxylic acid, and (d) water, wherein the polishing composition has a pH of about 3 to about 6, (ii) moving the polishing pad and the chemical mechanical polishing composition relative to the substrate, and (iii) abrading at least a portion of the substrate to polish the substrate.

BRIEF DESCRIPTION OF THE DRAWING

FIG. 1 graphically depicts step height versus trench loss exhibited by a polishing composition comprising ceria and a methylated melamine-formaldehyde copolymer in the polishing of a 900 μm×900 μm patterned substrate.

DETAILED DESCRIPTION OF THE INVENTION

The invention provides a chemical-mechanical polishing composition comprising, consisting essentially of, or consisting of (a) wet-process ceria, (b) a water-soluble cationic polymer or copolymer, (c) an aromatic carboxylic acid or heteroaromatic carboxylic acid, and (d) water, wherein the polishing composition has a pH of about 3 to about 6.

The chemical-mechanical polishing composition comprises a ceria abrasive. As is known in the art, ceria is an oxide of the rare earth metal cerium, and is known as ceric oxide, cerium oxide (e.g., cerium(IV) oxide), or cerium dioxide. Cerium(IV) oxide ($CeO_2$) can be formed by calcining cerium oxalate or cerium hydroxide. Cerium also forms cerium(III) oxides such as, for example, $Ce_2O_3$. The ceria abrasive can be any one or more of these or other oxides of ceria.

The ceria abrasive can be of any suitable type. As used herein, "wet-process" ceria refers to a ceria prepared by a precipitation, condensation-polymerization, or similar process (as opposed to, for example, fumed or pyrogenic ceria). A polishing composition of the invention comprising a wet-process ceria abrasive can exhibit lower defects when used to polish substrates according to a method of the invention. Without wishing to be bound to a particular theory, it is believed that wet-process ceria comprises spherical ceria particles and/or smaller aggregate ceria particles, thereby resulting in lower substrate defectivity when used in the inventive method. An illustrative wet-process ceria is HC-60™ ceria commercially available from Rhodia.

The ceria particles can have any suitable average size (i.e., average particle diameter). If the average ceria particle size is too small, the polishing composition may not exhibit sufficient removal rate. In contrast, if the average ceria particle size is too large, the polishing composition may exhibit undesirable polishing performance such as, for example, poor substrate defectivity. Accordingly, the ceria particles can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the ceria can have an average particle size of about 1,000 nm or less, for example, about 750 nm or less, about 500 nm or less, about 250 nm or less, about 150 nm or less, about 100 nm or less, about 75 nm or less, or about 50 nm or less. Thus, the ceria can have an average particle size bounded by any two of the aforementioned endpoints. For example, the ceria can have an average particle size of about 10 nm to about 1,000 nm, about 10 nm to about 750 nm, about 15 nm to about 500 nm, about 20 nm to about 250 nm, about 20 nm to about 150 nm, about 25 nm to about 150 nm, about 25 nm to about 100 nm, or about 50 nm to about 150 nm, or about 50 nm to about 100 nm. For non-spherical ceria particles, the size of the particle is the diameter of the smallest sphere that encompasses the particle. The particle size of the ceria can be measured using any suitable technique, for example, using laser diffraction techniques. Suitable particle size measurement instruments are available from e.g., Malvern Instruments (Malvern, UK).

The ceria particles preferably are colloidally stable in the inventive polishing composition. The term colloid refers to the suspension of ceria particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition can comprise any suitable amount of ceria abrasive. If the polishing composition of the invention comprises too little ceria abrasive, the composition may not exhibit sufficient removal rate. In contrast, if the polishing composition comprises too much ceria abrasive then the polishing composition may exhibit undesirable polishing performance and/or may not be cost effective and/or may lack stability. The polishing composition can comprise about 10 wt. % or less of ceria, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less of ceria, or about 0.5 wt. % or less of ceria. Alternatively, or in addition, the polishing composition can comprise about 0.01 wt. % or more, for example, about 0.05 wt. % or more, about 0.1 wt. % or more, about 0.2 wt. % or more, about 0.3 wt. % or more, about 0.4 wt. % or more, about 0.5 wt. % or more, or about 1 wt. % or more of ceria. Thus, the polishing composition can comprise ceria in an amount bounded by any two of the aforementioned endpoints. For example, the polishing composition can comprise about 0.01 wt. % to about 10 wt. % of ceria, about 0.05 wt. % to about 10 wt. %, about 0.05 wt. % to about 9 wt. %, about 0.05 wt. % to about 8 wt. %, about 0.05 wt. % to about 7 wt. %, about 0.05 wt. % to about 6 wt. %, about 0.05 wt. % to about 5 wt. %, about 0.05 wt. % to about 4 wt. %, about 0.05 wt. % to about 3 wt. %, about 0.05 wt. % to about 2 wt. %, about 0.05 wt. % to about 1 wt. %, about 0.2 wt. % to about 2 wt. %, about 0.2 wt. % to about 1 wt. %, or about 0.3 wt. % to about 0.5 wt. % of ceria. In an embodiment, the polishing composition comprises, at point-of-use, about 0.05 wt. % to about 2 wt. % of ceria (e.g., about 0.4 wt. % of ceria).

The polishing composition comprises a water-soluble cationic polymer or copolymer. The water-soluble cationic polymer or copolymer can be any suitable water-soluble cationic polymer or copolymer. Preferably, the polishing composition comprises a water-soluble cationic polymer which is a cross-linked cationic copolymer prepared from the polymerization of melamine or a halogenated derivative thereof and an aldehyde. More preferably, the water-soluble cationic polymer comprises a melamine-formaldehyde copolymer, and most preferably, the melamine-formaldehyde copolymer is a methylated melamine-formaldehyde copolymer. The methylated melamine-formaldehyde copolymer comprises monomeric units of the formula:

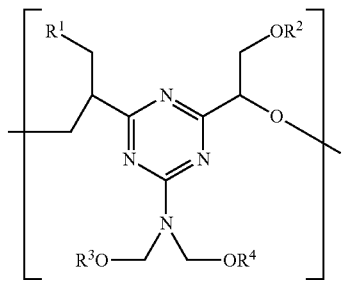

wherein $R^1$-$R^4$ are methyl or hydrogen, and wherein at least one of $R^1$-$R^4$ is methyl. An example of a suitable methylated melamine-formaldehyde copolymer is Saduren™ 163 (BASF Corporation, Charlotte, N.C.).

The polishing composition can comprise any suitable amount of the water-soluble cationic polymer or copolymer. The polishing composition can comprise about 500 ppm or less of the water-soluble cationic polymer or copolymer, for example, about 450 ppm or less, about 400 ppm or less, about 350 ppm or less, about 300 ppm or less, about 250 ppm or less, or about 200 ppm or less of the water-soluble cationic polymer or copolymer. Alternatively, or in addition, the polishing composition can comprise about 1 ppm or more, for example, about 5 ppm or more, about 10 ppm or more, about 20 ppm or more, about 30 ppm or more, about 40 ppm or more, or about 50 ppm or more of the water-soluble cationic polymer or copolymer. Thus, the water-soluble cationic polymer or copolymer can be present in the polishing composition in a concentration bounded by any two of the aforementioned endpoints. For example, the polishing composition can comprise about 1 ppm to about 500 ppm, for example about 5 ppm to about 500 ppm, about 10 ppm to about 500 ppm, about 20 ppm to about 500 ppm, about 30 ppm to about 500 ppm, about 40 ppm to about 500 ppm, about 50 ppm to about 500 ppm, about 50 ppm to about 450 ppm, about 50 ppm to about 400 ppm, about 50 ppm to about 350 ppm, about 50 ppm to about 300 ppm, about 50 ppm to about 250 ppm, about 50 ppm to about 200 ppm of the water-soluble cationic polymer or copolymer, or about 50 ppm to about 150 ppm of the water-soluble cationic polymer or copolymer.

The polishing composition comprises an aromatic carboxylic acid or heteroaromatic carboxylic acid. The aromatic carboxylic acid or heteroaromatic carboxylic acid can be any suitable aromatic carboxylic acid or heteroaromatic carboxylic acid. Non-limiting examples of aromatic carboxylic acids or heteroaromatic carboxylic acids include benzoic acid, 1,2-benzenedicarboxylic acid, 1,3-benzenedicarboxylic acid, 1,4-benzenedicarboxylic acid, salicylic acid, picolinic acid, dipicolinic acid, and the like. Preferably, the aromatic carboxylic acid or heteroaromatic carboxylic acid is picolinic acid.

The polishing composition can have any suitable pH. Typically, the polishing composition can have a pH of about 2 or more, e.g., about 2.5 or more, about 3 or more, about 3.5 or more, or about 3 or more. Alternatively, or in addition, the polishing composition can have a pH of about 7 or less, e.g., about 6.5 or less, about 6 or less, about 5.5 or less, or about 5 or less. Thus, the polishing composition can have a pH bounded by any two of the above endpoints recited for the polishing composition. For example the polishing composition can have a pH of about 2 to about 7, e.g., about 2.5 to about 7, about 3 to about 7, about 3.5 to about 7, about 4 to about 7, about 2.5 to about 6.5, about 2.5 to about 6, about 2.5 to about 5.5, about 2.5 to about 5, about 3 to about 6.5, about 3 to about 6, about 3 to about 5, or about 3.5 to about 5.5.

The pH of the polishing composition can be adjusted using any suitable acid or base. Non-limiting examples of suitable acids include nitric acid, sulfuric acid, phosphoric acid, and organic acids such as acetic acid. Non-limiting examples of suitable bases include sodium hydroxide, potassium hydroxide, and ammonium hydroxide.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide in the polishing composition typically is about 1 to about 50 ppm, preferably about 10 to about 40 ppm, more preferably about 20 to about 30 ppm.

The polishing composition is free or substantially free of an oxidizing agent that oxidizes a metal. As used herein, the phrase "free of oxidizing agent" means that the polishing composition includes no more than trace contaminant amounts of oxidizing materials, which amounts are insufficient to affect any metal removal rate obtainable with the composition during CMP. In a particular embodiment, the polishing composition is free or substantially free of hydrogen peroxide, ferric nitrate, potassium iodate, peracetic acid, and potassium permanganate.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., wet-process ceria, water-soluble cationic polymer or copolymer, aromatic carboxylic acid or heteroaromatic carboxylic acid, optional pH adjustor, etc.) as well as any combination of ingredients (e.g., wet-process ceria, water-soluble cationic polymer or copolymer, aromatic carboxylic acid or heteroaromatic carboxylic acid, optional pH adjustor, etc.).

For example, the wet-process ceria can be dispersed in water. The water-soluble cationic polymer or copolymer and aromatic carboxylic acid or heteroaromatic carboxylic acid can then be added and mixed by any method that is capable of incorporating the components into the polishing composition. The polishing composition also can be prepared by mixing the components at the surface of the substrate during the polishing operation.

The polishing composition can be supplied as a one-package system comprising wet-process ceria, water-soluble cationic polymer or copolymer, aromatic carboxylic acid or heteroaromatic carboxylic acid, optional pH adjustor, and water. Alternatively, the wet-process ceria can be supplied as a dispersion in water in a first container, and the water-soluble cationic polymer or copolymer, aromatic carboxylic acid or heteroaromatic carboxylic acid, and optional pH adjustor can be supplied in a second container, either in dry form, or as a solution or dispersion in water, to form an additive solution. The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

Various methods can be employed to utilize such a two-package polishing system. For example, the cerium oxide slurry and additive solution can be delivered to the polishing table by different pipes that are joined and connected at the outlet of supply piping. The cerium oxide slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

The polishing composition of the invention also can be provided as a concentrate which is intended to be diluted with an appropriate amount of water prior to use. In such an embodiment, the polishing composition concentrate can comprise the wet-process ceria, water-soluble cationic polymer or copolymer, aromatic carboxylic acid or heteroaromatic carboxylic acid and optional pH adjustor, in amounts such that, upon dilution of the concentrate with an appropriate amount of water, each component of the polishing composition will be present in the polishing composition in an amount within the appropriate range recited above for each component. For example, the wet-process ceria, water-soluble cationic polymer or copolymer, aromatic carboxylic acid or heteroaromatic carboxylic acid, and optional pH adjustor can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The substrate to be polished using the method of the invention can be any suitable substrate, especially a substrate that comprises silicon oxide.

The following examples further illustrate the invention but, of course, should not be construed as in any way limiting its scope.

Patterned wafers used in the Examples comprised a blanket layer of TEOS deposited over a patterned silicon substrate having lines etched into the surface thereof. The substrates are referred to herein as having a 900 µm×900 µm pattern wherein the width of the "up" regions of the surface lying over the unetched regions of the substrate was 900 µm, and the width of the "down" regions of the surface lying over the lines was 900 µm. Remaining step height refers to the thickness of TEOS lying over the unetched regions of the surface. Trench loss is a measurement relating to the removal of TEOS within the lines and between the up regions.

Example 1

This example demonstrates the effect of a water-soluble cationic polymer on the TEOS removal rate exhibited by a polishing composition comprising wet-process ceria.

Similar substrates comprising a blanket layer of TEOS were polished with 5 different polishing compositions (Polishing Compositions 1A-1E) containing 0.286 wt. % of wet-process ceria and 500 ppm of picolinic acid in water, with the pH adjusted to 4.0 using triethanolamine. Polishing Compositions 1A-1E further contained 50 ppm, 100 ppm, 150 ppm, 200 ppm, or 250 ppm of the water-soluble cationic polymer Saduren™ 163 (BASF Corp. Charlotte, N.C.), respectively, which is a methylated melamine-formaldehyde copolymer. For each polishing experiment, a substrate was polished with a control polishing composition that contained 0.286 wt. % of wet-process ceria and 500 ppm of picolinic acid in water, with the pH adjusted to 4.0 using triethanolamine but which did not contain the water-soluble cationic polymer.

Following polishing, the TEOS removal rates were determined. The results are set forth in Table 1.

TABLE 1

| Polishing Composition | Saduren ™ 163 Concentration (ppm) | TEOS Removal Rate (Å/min) | Control TEOS Removal Rate (Å/min) |
|---|---|---|---|
| 1A | 50 | 7683 | 7849 |
| 1B | 100 | 8236 | 8039 |
| 1C | 150 | 8660 | 8188 |
| 1D | 200 | 8479 | 8188 |
| 1E | 250 | 8305 | 8188 |

As is apparent from the results set forth in Table 1, the presence of Saduren™ 163 in the polishing compositions at a concentration of 100 ppm to 250 ppm results in an increase in TEOS blanket removal rate of approximately 2.5% to 5.8%, with the greatest increase observed at a concentration of Saduren™ 163 of 150 ppm.

Example 2

This example demonstrates the effect of a water-soluble cationic polymer on the planarization efficiency exhibited by a polishing composition comprising wet-process ceria.

Separate substrates comprising a layer of TEOS deposited on a 900 μm×900 μm patterned silicon substrate were polished with 4 different polishing compositions (Polishing Compositions 2A-2D) containing 0.286 wt. % of wet-process ceria and 500 ppm of picolinic acid in water, with the pH adjusted to 4.0 using triethanolamine. Polishing Compositions 2A-2D further contained 100 ppm, 150 ppm, 200 ppm, or 250 ppm of Saduren™ 163, a methylated melamine-formaldehyde copolymer. Each substrate was polished for the same length of time.

Following polishing, the TEOS removal rates were determined, and the remaining step height and trench loss were measured. The polishing tool was a 200 mm Mirra™ polishing tool (Applied Materials, Santa Clara, Calif.). The results are set forth in Table 2.

TABLE 2

| Polishing Composition | Saduren ™ 163 concentration (ppm) | TEOS Removal Rate (Å/min) | Remaining Step Height (Å) | Trench Loss (Å) |
|---|---|---|---|---|
| 2A | 100 | 8770 | 404 | 2679 |
| 2B | 150 | 9006 | 396 | 3657 |
| 2C | 200 | 8528 | 604 | 5471 |
| 2D | 250 | 5957 | 2297 | 7973 |

As is apparent from the results set forth in Table 2, the trench loss is minimized at a 100 ppm concentration of Saduren™ 163. The trench loss and remaining step height is highest at a 250 ppm concentration of Saduren™ 163.

Example 3

This example demonstrates the effect of a methylated melamine-formaldehyde copolymer on the planarization efficiency exhibited by a polishing composition comprising wet-process ceria.

Separate substrates comprising a layer of TEOS deposited on a 900 μm×900 μm patterned silicon substrate were polished with 2 different polishing compositions (Polishing Compositions 3A and 3B) containing 0.286 wt. % of wet-process ceria and 500 ppm of picolinic acid in water, with the pH adjusted to 4.0 using triethanolamine. Polishing Composition 3A (control) did not contain any further components. Polishing Composition 3B (invention) further contained 100 ppm of Saduren™ 163.

Four substrates were polished with Polishing Composition 3A for different amounts of time, with longer polishing times indicated by a higher polishing time period number. Six substrates were polished with Polishing Composition 3B for different amounts of time, with longer polishing times indicated by a higher polishing time period number. The polishing tool was a 300 mm Reflexion™ polishing tool (Applied Materials, Santa Clara, Calif.).

Following polishing, the remaining step height and trench loss were measured. The results are set forth in Table 3. The results are also depicted graphically in FIG. 1.

TABLE 3

| Polishing Composition | Polishing Time (s) | Remaining Step Height (Å) | Trench Loss (Å) |
|---|---|---|---|
| 3A (comparative) | 37 | 963 | 1416 |
| 3A | 40 | 865 | 1721 |
| 3A | 42 | 664 | 1981 |
| 3A | 45 | 626 | 2341 |
| 3B (invention) | 25 | 2103 | 277 |
| 3B | 35 | 895 | 1050 |
| 3B | 40 | 682 | 1466 |
| 3B | 40 | 670 | 1597 |
| 3B | 45 | 556 | 2263 |
| 3B | 50 | 435 | 2912 |

As is apparent from the results set forth in Table 3 and depicted in FIG. 1, the use of Polishing Composition 3B, which contained Saduren™ 163, resulted in less trench loss than observed for Polishing Composition 3A, which did not contain Saduren™ 163.

Example 4

This example demonstrates the effect of a methylated melamine-formaldehyde copolymer on the planarization efficiency exhibited by a polishing composition comprising wet-process ceria in both "one pack" and "two pack" systems.

Separate substrates comprising a layer of TEOS deposited on a 900 μm×900 μm patterned silicon substrate were polished with a polishing composition containing 0.286 wt. % of wet-process ceria, 100 ppm of Saduren™ 163, and 500 ppm of picolinic acid in water, with the pH adjusted to 4.0 using triethanolamine. The substrates were polished with the polishing composition for different amounts of time, with longer polishing times indicated by a higher polishing time period number. The polishing composition used to polish six of the substrates was prepared as a "one pack" polishing composition wherein all of the components were combined and stored before use. The polishing composition used to polish two of the substrates was prepared from a "two pack" polishing composition wherein the ceria in water was combined at the point-of-use with a composition containing Saduren™ 163 and picolinic acid in water, immediately prior to use.

The polishing tool was a 300 mm Reflexion™ polishing tool. Following polishing, the remaining step height and trench loss were measured. The results are set forth in Table 4.

TABLE 4

| System Type | Polishing Time Period | Remaining Step Height (Å) | Trench Loss (Å) |
|---|---|---|---|
| "One Pack" System | 1 | 2103 | 277 |
| | 2 | 895 | 1050 |
| | 3 | 682 | 1466 |
| | 4 | 670 | 1597 |
| | 5 | 556 | 2263 |
| | 6 | 435 | 2912 |
| "Two Pack" System | 1 | 730 | 1369 |
| | 2 | 508 | 2050 |

As is apparent from the results set forth in Table 4, the performance of the polishing composition in the "one pack" and "two pack" configurations is comparable. At time point 3, polishing with the one pack system resulted in a remaining step height of 682 Å and a trench loss of 1466 Å, while polishing with the two pack system at time point 1 resulted in a remaining step height of 730 Å and a trench loss of 1369 Å.

Example 5

This example demonstrates the effect of a water-soluble cationic polymer on the planarization efficiency exhibited by a polishing composition comprising wet-process ceria.

Separate substrates comprising a layer of TEOS deposited on a 900 μm×900 μm patterned silicon substrate were polished with 2 different polishing compositions (Polishing Compositions 5A and 5B) containing 0.286 wt. % of wet-process ceria, 500 ppm of picolinic acid in water, 250 ppm of triethanolamine, and 50 ppm of acetic acid, with the pH adjusted to 4.0 using additional triethanolamine. Polishing Composition 5A (control) did not contain any further components. Polishing Composition 5B (invention) further contained 100 ppm of Saduren™ 163, a methylated melamine-formaldehyde copolymer.

Five substrates were polished for different amounts of time with Polishing Composition 5A. Two substrates were polished for different amounts of time with Polishing Composition 5B.

The polishing tool was a 300 mm Reflexion™ polishing tool. Following polishing, the remaining step height and trench loss were measured. The results are set forth in Table 5.

TABLE 5

| Polishing Composition | Polishing time (s) | Remaining Step Height (Å) | Trench Loss (Å) |
|---|---|---|---|
| 5A (comparative) | 37 | 963 | 1416 |
| 5A | 42 | 720 | 2011 |
| 5A | 45 | 606 | 2442 |
| 5B (invention) | 47 | 560 | 1984 |
| 5B | 49 | 535 | 1883 |

Polishing Composition 5 A showed remaining step heights of 720 Å and 606 Å for the 42 second and 45 second polishing, respectively, with trench loss amounts of 2011 Å and 2442 Å, respectively. Polishing Composition 5B showed remaining step heights of 560 Å and 535 Å for 47 seconds and 49 seconds, respectively, with trench loss amounts of 1984 Å and 1883 Å, respectively. Thus, polishing of the patterned substrate with Polishing Composition 5B, which contained Saduren™ 163, resulted in less trench loss while allowing for greater reduction in step height as compared with Polishing Composition 5A, which did not contain Saduren™ 163.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) wet-process ceria,
   (b) a water-soluble cationic polymer or copolymer, wherein the water-soluble cationic polymer is a cross-linked cationic copolymer prepared from the polymerization of melamine or a halogenated derivative thereof and an aldehyde,
(c) an aromatic carboxylic acid or heteroaromatic carboxylic acid, and
(d) water, wherein the polishing composition has a pH of about 3 to about 6.

2. The polishing composition of claim 1, wherein the polishing composition comprises about 0.05 wt. % to about 2 wt. % of wet-process ceria.

3. The polishing composition of claim 1, wherein the water-soluble cationic polymer is a melamine-formaldehyde copolymer.

4. The polishing composition of claim 3, wherein the melamine-formaldehyde copolymer is a methylated melamine-formaldehyde copolymer.

5. The polishing composition of claim 1, wherein the polishing composition comprises about 50 ppm to about 200 ppm of the water-soluble cationic polymer or copolymer.

6. The polishing composition of claim 1, wherein the aromatic carboxylic acid or heteroaromatic carboxylic acid is picolinic acid or dipicolinic acid.

* * * * *